(12) United States Patent
Tsai et al.

(10) Patent No.: US 11,232,954 B2
(45) Date of Patent: Jan. 25, 2022

(54) SIDEWALL PROTECTION LAYER FORMATION FOR SUBSTRATE PROCESSING

(71) Applicant: Tokyo Electron Limited, Tokyo (JP)

(72) Inventors: Yu-Hao Tsai, Albany, NY (US); Mingmei Wang, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/819,918

(22) Filed: Mar. 16, 2020

(65) Prior Publication Data
US 2021/0287908 A1 Sep. 16, 2021

(51) Int. Cl.
*H01L 21/3065* (2006.01)
*H01L 21/02* (2006.01)

(52) U.S. Cl.
CPC .. *H01L 21/30655* (2013.01); *H01L 21/02164* (2013.01); *H01L 21/02238* (2013.01)

(58) Field of Classification Search
CPC ......... H01L 21/30655; H01L 21/02164; H01L 21/02238
See application file for complete search history.

(56) References Cited

U.S. PATENT DOCUMENTS

| | | | |
|---|---|---|---|
| 8,088,691 B2 | 1/2012 | Kiehlbauch et al. | |
| 8,288,287 B2 | 10/2012 | Takata et al. | |
| 2008/0286978 A1* | 11/2008 | Chen | H01L 21/30655 438/713 |
| 2010/0173494 A1* | 7/2010 | Kobrin | H01L 21/0337 438/694 |
| 2012/0100720 A1 | 4/2012 | Winniczek et al. | |
| 2014/0057446 A1 | 2/2014 | Yu et al. | |
| 2016/0163557 A1 | 6/2016 | Hudson et al. | |
| 2017/0178920 A1* | 6/2017 | Dole | H01L 21/31116 |

FOREIGN PATENT DOCUMENTS

| | | |
|---|---|---|
| JP | 2007103876 A | 4/2007 |
| KR | 101377866 B1 | 3/2014 |

OTHER PUBLICATIONS

International Searching Authority, Notification of Transmittal of the International Search Report and the Written Opinion of the International Searching Authority, or the Declaration, PCT/US2020/066379, dated Apr. 22, 2021, total 10 pages.

* cited by examiner

*Primary Examiner* — Anita K Alanko
(74) *Attorney, Agent, or Firm* — Slater Matsil, LLP (57) ABSTRACT

Substrate processing techniques are described in which an etch protection layer that is formed as part of an etch process forms in a self-limiting nature. Thus, over deposition effects are minimized, particularly in the corners of etched polygonal holes. In one embodiment, the layer being etched contains silicon and the protective layer comprises a silicon oxide (SixOy). The process may include the use of a cyclical series of etch and protective layer formation steps. In the case of a silicon oxide based protective layer, a thin protective layer of silicon oxide may be formed in a limiting and controllable manner due to the nature of the oxygen atom interaction with silicon and newly formed silicon oxide protective layers. In this manner, a polygonal hole may be formed without detrimental over deposition of a protective layer in corners of the hole.

22 Claims, 7 Drawing Sheets

SIDEWALL PROTECTION LAYER FORMATION FOR SUBSTRATE PROCESSING

BACKGROUND

The present disclosure relates to the formation of sidewall protection layers during substrate processing. More particularly, the present disclosure provides a method to form protection layers during the etching of holes, such as via holes and contact holes.

The use of protection layers during etch processes has long been known. For example, using fluorocarbon chemistries in a plasma system for the etching of substrates has widely been used to provide a carbon based protection layer to the sidewalls of a hole being etched so as to enable anisotropic etching. Such fluorocarbon plasma processing is well known, for example, for the processing of semiconductor wafers. In such fluorocarbon processing techniques, deposition of a carbon based sidewall protection layer generally continuously occurs during the etch process. In this regard, the sidewall deposition process is not self-limiting.

As geometries in substrate processing continue to shrink, the technical challenges to forming structures on substrates increase. With regard to the formation of protective layers, as geometries shrink, over deposition of protective layers during continuous sidewall deposition etch processes may significantly affect the size of the pattern being formed on the substrate. This issue is worsened when the pattern being generated has corners as the over deposition will build up even more in corner locations. Thus, for example, polygonal holes that are being etched with a chemistry that provides a fluorocarbon sidewall protective layer may exhibit an undesirable over deposition accumulation of the carbon based sidewall protective layer, particularly in the corners of the hole. Such over deposition may undesirably change the target geometries of the features being formed. Further, over deposition in corners can lead to etch shadowing effects which create footing remnants of the layer being etched in the corners of the contact hole or via hole being formed. Thus, such corner and footing issues may materially affect the shape of the hole being formed, particularly in corners and at the base of the hole. These problems will then impact the performance of the structures being created.

Figure 1A:
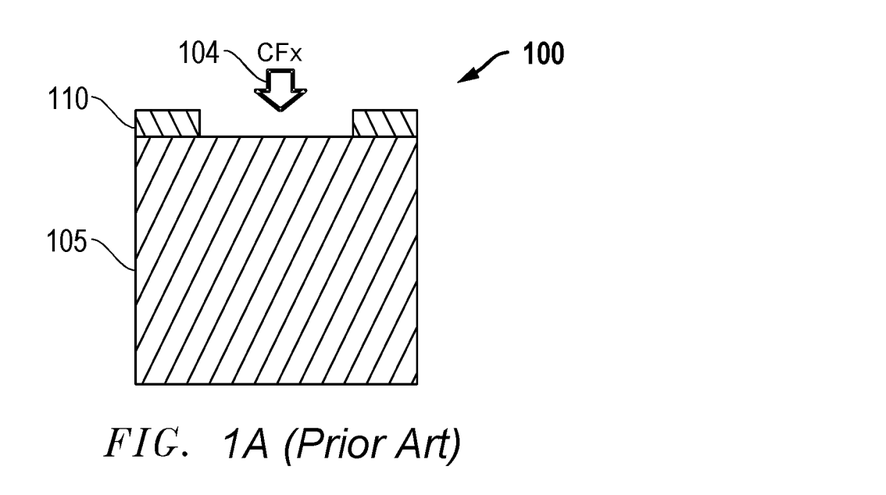
FIGS. 1A-1C illustrate a cross-sectional view of prior art hole formation having protective layer over deposition.
Figure 1B:
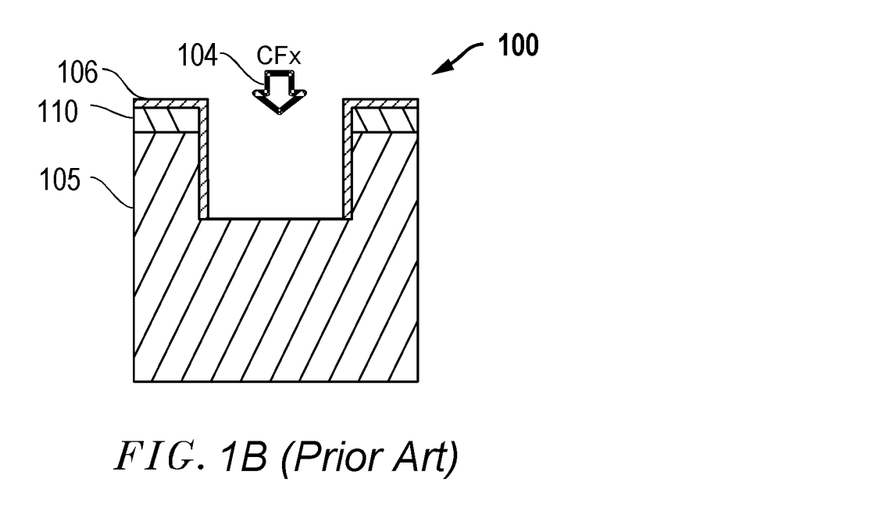
Figure 1C:
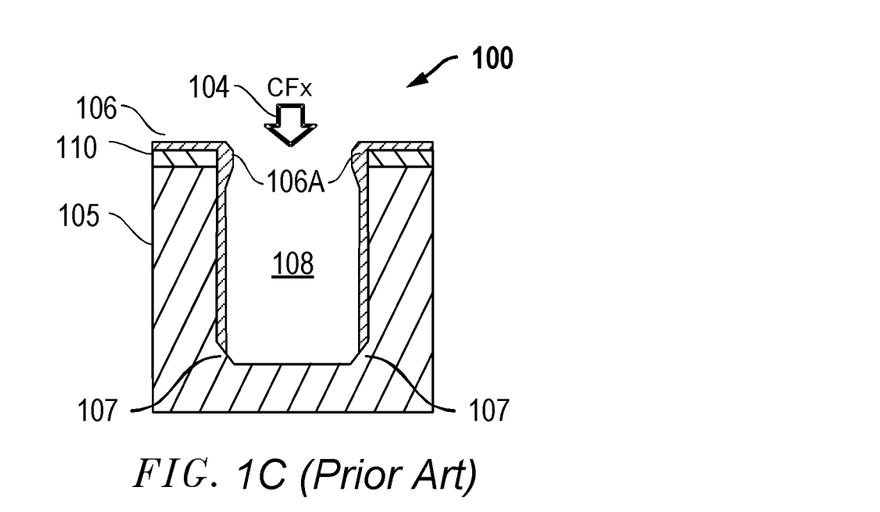
Figure 1D:
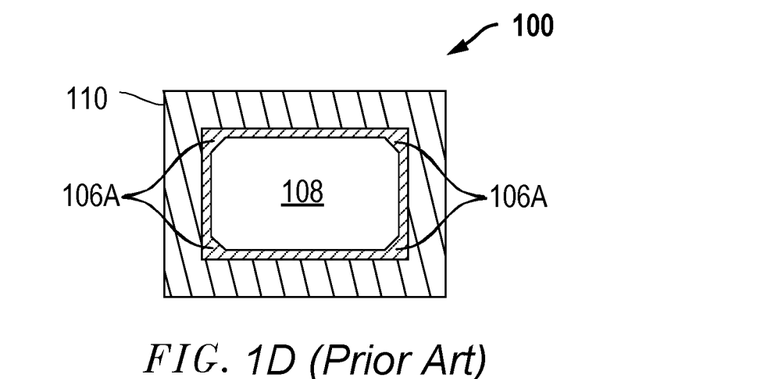
FIG. 1D illustrates a top view of the substrate at the process step of the FIG. 1C cross-sectional view.

FIGS. 1A-1C illustrate a cross-sectional view of a substrate processing flow illustrating these problems. FIG. 1D illustrates a top view of the process flow at the process step of FIG. 1D. As shown in FIG. 1A, a substrate 100 having a silicon layer 105 and a masking layer 110 is provided. As shown in FIG. 1A, the masking layer 110 has been provided with an exemplary pattern which corresponds to a desired hole pattern which is to be formed in the silicon layer 105. As further shown in FIG. 1A, the substrate 100 may be exposed to a fluorocarbon plasma 104 to etch the silicon layer 105. As shown in FIG. 1B, a carbon based sidewall protective layer 106 may form during the etching of the silicon layer 105. FIG. 1C illustrates the effects that occur from the undesirable over deposition accumulation of the carbon based sidewall protective layer 106. In particular, as shown in FIG. 1C protective layer over deposition 106A of the carbon based sidewall protective layer 106 may form in the corners of the hole 108. Further, the protective layer over deposition 106A causes etch shadowing effects which create footing remnants 107 of the silicon layer 105 in the bottom corners of the hole 108 being formed. FIG. 1D illustrates a top view of the substrate 100 at the process step shown in the FIG. 1C cross-section, illustrating the impact on the hole 108 in which the original polygon shape of the masking layer has been impacted by the protective layer over deposition 106A in the corner regions.

It is desirable to form a protection layer not subject to over deposition effects to provide a more controllable hole profile and controllable hole etch process.

SUMMARY

In one exemplary embodiment, described herein are techniques in which an etch protection layer that is formed as part of an etch process forms in a self-limiting nature. Thus, over deposition effects are minimized, particularly in the corners of etched polygonal holes. In one embodiment, the layer being etched contains silicon and the protective layer comprises a silicon oxide ($Si_xO_y$). The process may include the use of a cyclical series of etch and protective layer formation steps. In the case of a silicon oxide based protective layer, a thin protective layer of silicon oxide may be formed in a limiting and controllable manner due to the nature of the oxygen atom interaction with silicon and newly formed silicon oxide protective layers. In this manner, a polygonal hole may be formed without detrimental over deposition of a protective layer in corners of the hole.

In one embodiment, a method of etching a substrate is provided. The method may comprise providing the substrate with a patterned layer and an underlying layer and etching a portion of the underlying layer to form exposed sidewalls of the underlying layer. The method further comprises exposing the substrate to a protective layer formation plasma, the protective layer formation plasma reacting with the exposed sidewalls of the underlying layer to form a self-limiting protective layer comprised of a first material provided from the protective layer formation plasma and a second material provided from the underlying layer, the protective layer formation plasma reacting with the exposed sidewalls of the underlying layer to also release a reaction by-product. Finally, the method may comprise cyclically repeating the etching of the underlying layer and the exposing the substrate to the protective layer formation plasma, wherein the cyclically repeating provides for etching a pattern of the patterned layer in the underlying layer by utilizing the self-limiting protective layer to avoid over deposition of materials on the exposed sidewalls of the underlying layer.

In some embodiments of the described methods, the underlying layer comprises silicon, the self-limiting protective layer comprises silicon oxide, and/or the reaction by-product comprises oxygen. In some embodiments, the self-limiting protective layer is 10 nm or less thick and in other embodiments, the self-limiting protective layer is 2 nm or less thick. In some embodiments, the pattern of the patterned layer is a via hole or contact hole. In some embodiments, the via hole or contact hole is a square or a rectangle. In still other embodiments, the cyclical repeating the etching and exposing are configured to optimize throughput and structure profile. In still other embodiments, the method is optimized by controlling oxidation time, oxygen pressure, and oxygen flowrate.

In yet another embodiment, a method of etching a substrate is described. The method may comprise providing the substrate with a patterned layer having a first pattern, the substrate also having a silicon layer and etching the silicon layer to form a silicon patterned layer having a silicon layer pattern corresponding to the first pattern, wherein the etching the silicon layer comprising a cyclical plasma process.

Further the cyclical plasma process may comprise (1) exposing the substrate to a first plasma, the first plasma comprising oxygen; the first plasma reacting with sidewalls of the silicon layer to form silicon oxide on at least sidewalls of the silicon layer; (2) exposing the substrate to a second plasma, the second plasma etching portions of the silicon layer; (3) wherein the silicon oxide protects the sidewalls of the silicon layer from the second plasma; and (4) repeating the exposing the substrate to the first plasma and the exposing the substrate to the second plasma.

In some embodiments of the methods disclosed, the second plasma is formed utilizing an etchant gas and an inert gas, the inert gas of the second plasma assists in removal of the silicon oxide located on non-sidewall regions of the silicon layer, the etchant gas comprises chlorine, hydrogen chloride, hydrogen bromide, or silicon fluorine, and/or a formation rate of the silicon oxide in the first plasma decreases with respect to time of the exposing the substrate to a first plasma step. In some embodiments, the silicon oxide on at least sidewalls of the silicon layer is 10 nm or less thick and in other embodiments the silicon oxide on at least sidewalls of the silicon layer is 2 nm or less thick.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

In one exemplary embodiment, described herein are techniques in which an etch protection layer that is formed as part of an etch process forms in a self-limiting nature. Thus, over deposition effects are minimized, particularly in the corners of etched polygonal holes. In one embodiment, the layer being etched contains silicon (Si) and the protective layer comprises a silicon oxide ($Si_xO_y$). The process may include the use of a cyclical series of etch and protective layer formation steps. In the case of a silicon oxide based protective layer, a thin protective layer of silicon oxide may be formed in a limiting and controllable manner due to the nature of the oxygen atom interaction with silicon and newly formed silicon oxide protective layers. In this manner, a polygonal hole may be formed without detrimental over deposition of a protective layer in corners of the hole.

The use of the formation of self-limiting protection layer is described herein in an exemplary embodiment with reference to a silicon layer being etched and the formation of a silicon oxide protective layer. However, it will be recognized that the concepts described herein are not limited to such chemistries. Thus for example, the techniques are more generically applicable to all possible chemistries with include a component A which may react with a target of B material to form A-B compositions and also a volatile A based gas.

In the exemplary embodiment involving the formation of a silicon oxide self-limiting protection layer when etching silicon, characteristics of oxygen (O) atoms and reaction of O atoms with silicon are advantageously utilized. In particular, O atoms need to bind with silicon to stay on the silicon surface while excessive O atoms will leave the reaction as either radicals or $O_2$. Thus a cyclical process of oxidizing the silicon (a self-limiting process) may be combined with an etch which will directionally etch the structure such that the sidewall silicon oxide will not be substantially etched while oxide formed at the base of the hole and the underlying silicon will be etched, for example when using a chlorine ($Cl_2$), hydrogen chloride (HCl), hydrogen bromide (HBr), silicon fluorine complex ($SiF_x$), etc. based plasma etch. The process may thus be a quasi atomic layer etch (ALE) of silicon.

The cyclical process of forming the self-limiting protective layer and etching of the silicon may be described by a series of steps applied to a patterned substrate. In one example, a substrate has a contact hole or via hole pattern formed in a photoresist or other masking layer (including, for example, hard masks) located upon a silicon target layer to be etched. First, oxygen radicals may be presented in the substrate processing system to convert exposed silicon surfaces (including silicon sidewalls) to silicon oxide. Second, an etch chemistry may be provided in the substrate processing system (for example a plasma based $Cl_2$, HCl, HBr, etc. chemistry). The etch chemistry may provide a high selectivity between the etch target layer (in this case silicon) and the protective layer (in this case silicon oxide). Included in the etch chemistry may be an inert gas (in one example argon (Ar)) which helps directionally etch/break up the silicon oxide formed at the bottom of the hole. In this manner, protective sidewall layers are formed on the silicon so that critical dimensions are maintained while the directional etching effects remove the protective material from the base of the hole. The protective sidewall formation and etch steps may then be cyclically repeated a number of times until the desired amount of the etch target layer (in this case silicon) is etched.

Further, the sidewalls of the hole being formed do not have an over formation of the silicon oxide protective layer because of the self-limiting nature of the process in which O radicals convert silicon to silicon oxide because the presence of silicon oxide over the silicon will limit the ability of O radicals to react with silicon as the silicon is not exposed. More specifically, due to the unique bonding nature of O atoms, the non-volatile SiOx forms from O interacting with Si, while volatile $O_2$ forms when incoming O is blocked by newly formed SiOx. Therefore, the formation of the oxide protection layer is relatively more controllable compared to traditional sidewall protective layers. Further, even a thin layer of silicon oxide has this characteristic so the critical dimensions of the structure being formed are not significantly impacted because the silicon oxide layer stays thin during this process. For example, thin layers of sidewall silicon oxide may be formed on the order of 30 nm or less nm, 10 or less or and even as thin as 2 nm or less.

As mentioned above, it will be recognized that the exemplary embodiment is described with relation to an O chemistry with a Si target which forms $Si_xO_y$ and a volatile $O_2$ gas. However, the techniques more generally apply to an "A" chemistry with a "B" target which forms "A-B" complexes and a volatile "$A_2$" gas.

FIGS. 2A-2G illustrate an exemplary process for utilizing the techniques as described herein. As discussed with reference to FIGS. 2A-2G, exemplary materials and exemplary process chemistries are described. However as described above, such materials and process chemistries are merely exemplary and the techniques described herein may be applicable to a wide range of materials and process chemistries.

Figure 2A:
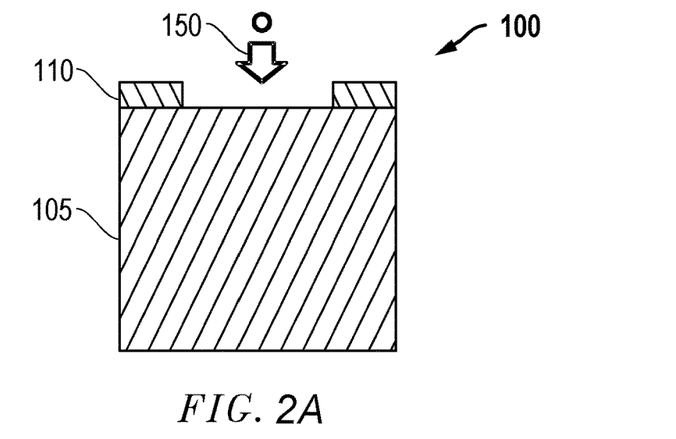
FIGS. 2A-2G illustrate an exemplary substrate processing process flow utilizing exemplary embodiments of the techniques described herein.
Figure 2B:
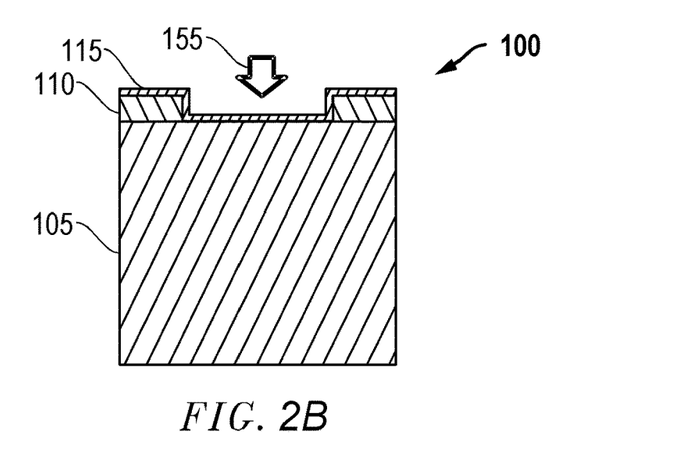
Figure 2C:
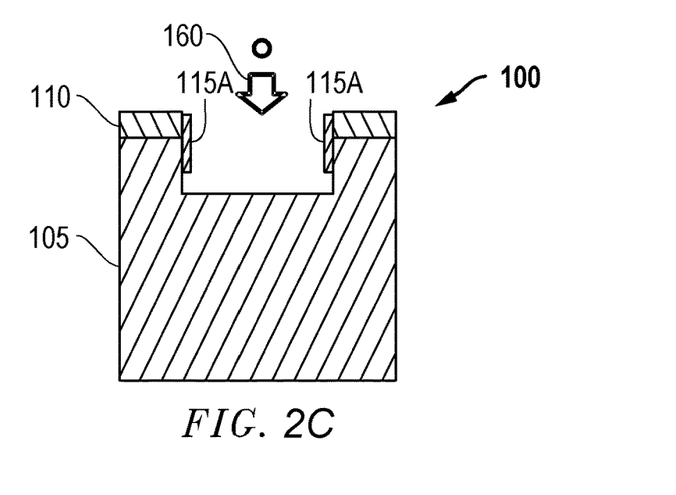
Figure 2D:
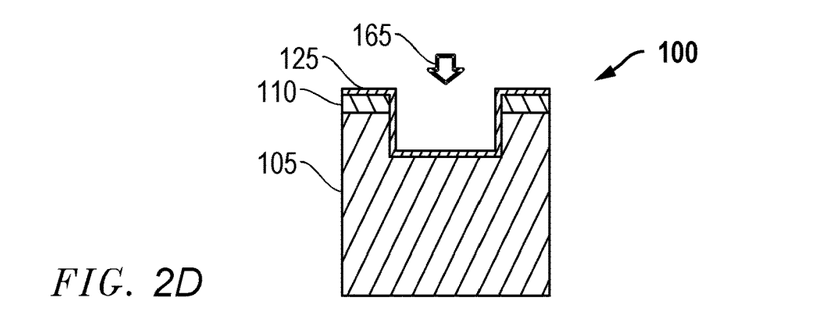
Figure 2E:
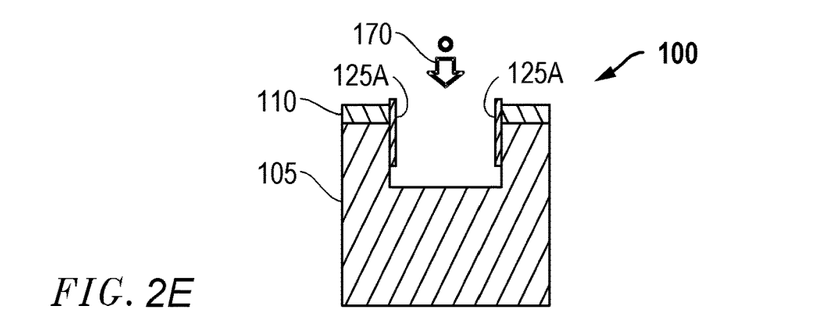
Figure 2F:
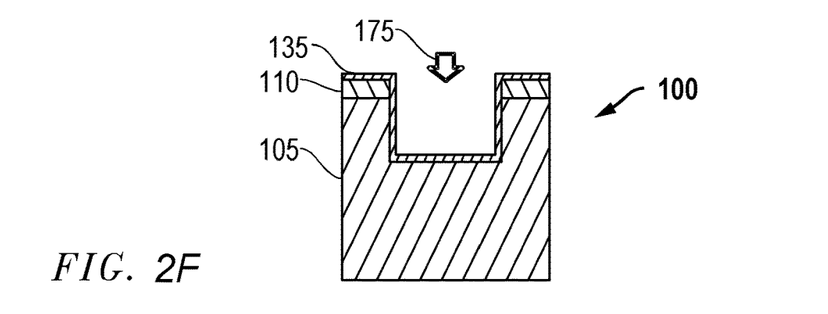
Figure 2G:
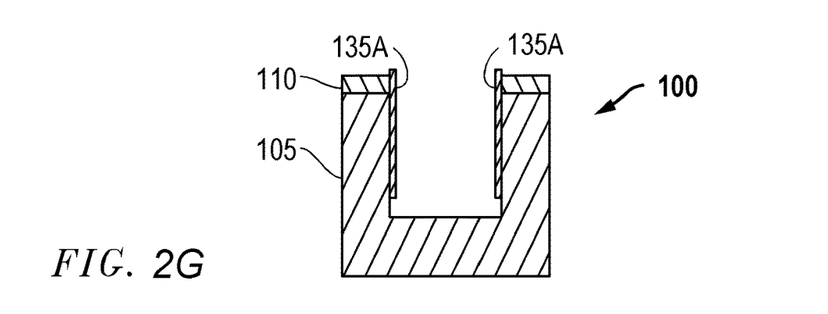

FIGS. 2A-2G illustrate a substrate 100 having a silicon layer 105 and a masking layer 110. As shown in FIG. 2A, the masking layer 110 has been provided with an exemplary pattern which corresponds to a desired hole pattern which is to be formed in the silicon layer 105. In one exemplary embodiment, the hole is polygonal shaped. In one more particular embodiment, the hole shape is a square. In another more particular embodiment, the hole shape is a rectangle. The masking layer may be any of a wide variety of known masking layers, including for example, photo resist, hard mask materials, etc., all which is well known in the art. As further shown in FIG. 2A, the substrate 100 may then be exposed to a first oxygen plasma 150. In one exemplary process, the oxygen plasmas described herein may be an oxygen plasma formed in a plasma chamber using an oxygen flow rate of 500 standard cubic centimeters per minute (sccm), 200 Watts (W) power of 60 MHz frequency, and pressure 50 mTorr. The first oxygen plasma 150 may then form a first protective layer 115 (in this example $Si_xO_y$) as shown in FIG. 2B. Next, the substrate 100 may be exposed to a first plasma etch 155 which may comprise an etchant gas (for example $Cl_2$, HBr, $SiF_x$, etc.) and an inert gas such as Ar for example. The Ar may be utilized to provide a sputtering effect to remove the $Si_xO_y$ from the top surface of the silicon layer 105 so as to allow the silicon layer 105 to be exposed to the etchant chemistry of the first plasma etch 155. The result of the first plasma etch 155 will yield the structure as shown in FIG. 2C. As shown in FIG. 2C, the first protective layer 115 has been removed from the horizontal surfaces of the substrate 100 and the first plasma etch 155 has also resulted in etching a portion of the silicon layer 105 according to the pattern of the masking layer 110. As also shown in FIG. 2C, the sidewalls of the first protective layer 115 remain as first protective layer remnant sidewalls 115A as such sidewalls are not removed by the directional sputtering effect of the first plasma etch 155. The process described above may then be repeated in a cyclical manner as shown by FIGS. 2C and 2D and by FIGS. 2E and 2F to provide a final structure as shown in FIG. 2G. More particularly, a second protective layer 125 may be formed by a second oxygen plasma 160 and then a second plasma etch 165 may be utilized to etch additional portions of the silicon layer 105 while leaving second protection layer remnant sidewalls 125A. Then, a third protective oxygen plasma 170 may be used to form a third protective layer 135 and then a third plasma etch 175 may be utilized to etch additional portions of the silicon layer 105 while leaving third protection layer remnant sidewalls 135A. It will be recognized that the number of cycles of the oxidation/etch process may be more or less than those shown in the figures as the figures are merely exemplary.

Thus, as described herein a self-limiting protection layer formation process is provided. The conversion of silicon to $Si_xO_y$ is limited as the formed $Si_xO_y$ blocks O atoms from further interaction with the silicon, thus avoiding excessive formation of the protection layer. More specifically, it is known that the growth rate of $Si_xO_y$ on silicon exposed to an oxygen plasma will decrease over time. Specifically, the conversion of silicon to $Si_xO_y$ is limited due to the blocking of Si—O—Si bond coordinates by the $Si_xO_y$ layer. Additionally, the conversion of silicon to $Si_xO_y$ is limited because of the shallow penetration of incoming oxygen atoms. The amount of $Si_xO_y$ formed in an oxygen plasma will vary depending upon the plasma conditions and variables (for example decreasing as pressure increases). In one embodiment, for example, the $Si_xO_y$ layer may saturate at approximately a thickness of 1.5 nm (approximately 0.5 nm beyond the original silicon surface).

Figure 3A:
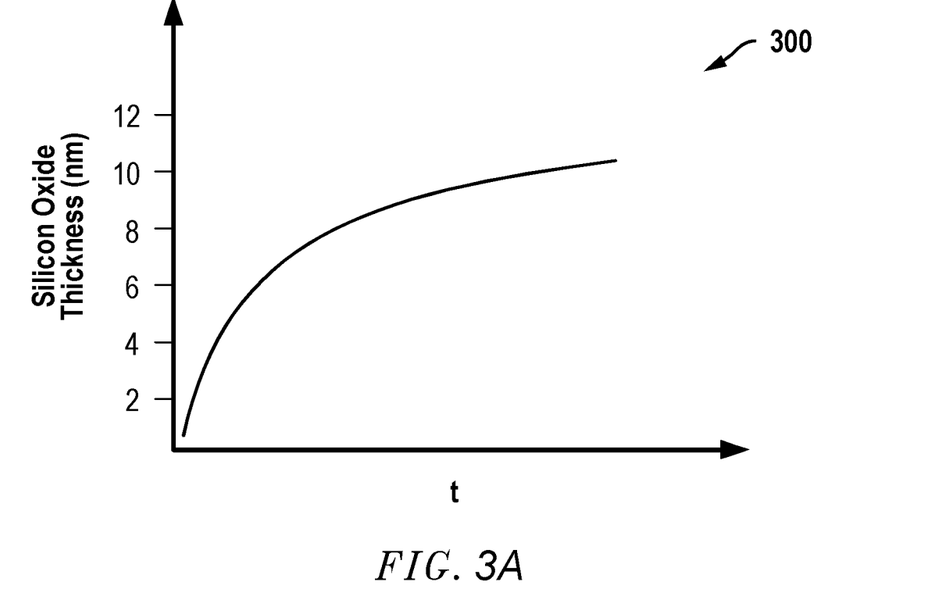
FIG. 3A illustrates the self-limiting nature of the formation of a silicon oxide.
Figure 3B:
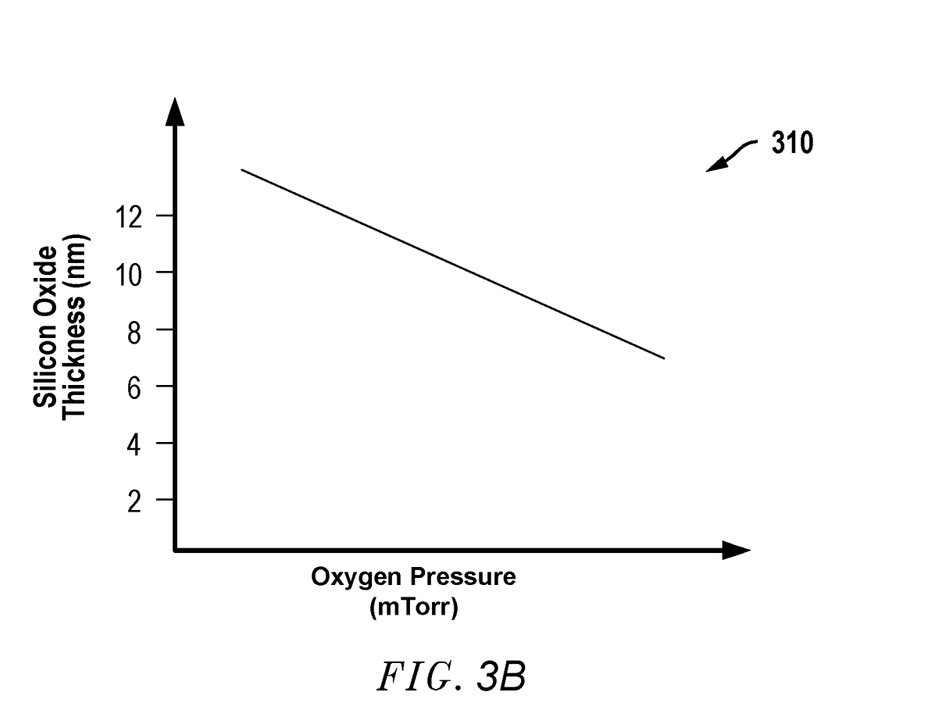
FIG. 3B illustrates the pressure dependence of silicon oxide thickness.

FIG. 3A illustrates an exemplary silicon oxide growth rate curve for silicon oxide thickness versus time resulting from exposing silicon to an oxygen plasma. It will be recognized that the actual formed thicknesses will vary depending upon the process conditions. As shown in FIG. 3A, silicon oxide thickness curve 300 increases at a decreasing rate with respect to time. A wide variety of process conditions may be utilized for formation of the silicon oxide. In general, however, the silicon oxide thickness will decrease as the process pressure increases, as illustrated by plot 310 of FIG. 3B.

The techniques disclosed herein may be utilized during the processing of a wide range of substrates. The substrate may be any substrate for which the formation of sidewall protection layers is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow, for example front end of line (FEOL) processing steps and back end of line (BEOL) processing steps.

The techniques described herein may be utilized with a wide range of plasma processing systems. For example, the techniques may be utilized with plasma etch process systems, plasma deposition process systems or any other plasma process system.

It will be recognized that a wide variety of substrate processing systems may equally implement the concepts described herein. For example, the substrate processing system may be a plasma processing system. In exemplary embodiments, the plasma processing system may be a capacitively coupled plasma processing apparatus, inductively coupled plasma processing apparatus, microwave plasma processing apparatus, RLSA™ microwave plasma processing apparatus, electron cyclotron resonance (ECR) plasma processing apparatus, etc. Thus, it will be recognized by those skilled in the art that the techniques described herein may be utilized with any of a wide variety of substrate processing systems, the structures of which are well known to those of skill in the art.

Figure 4:
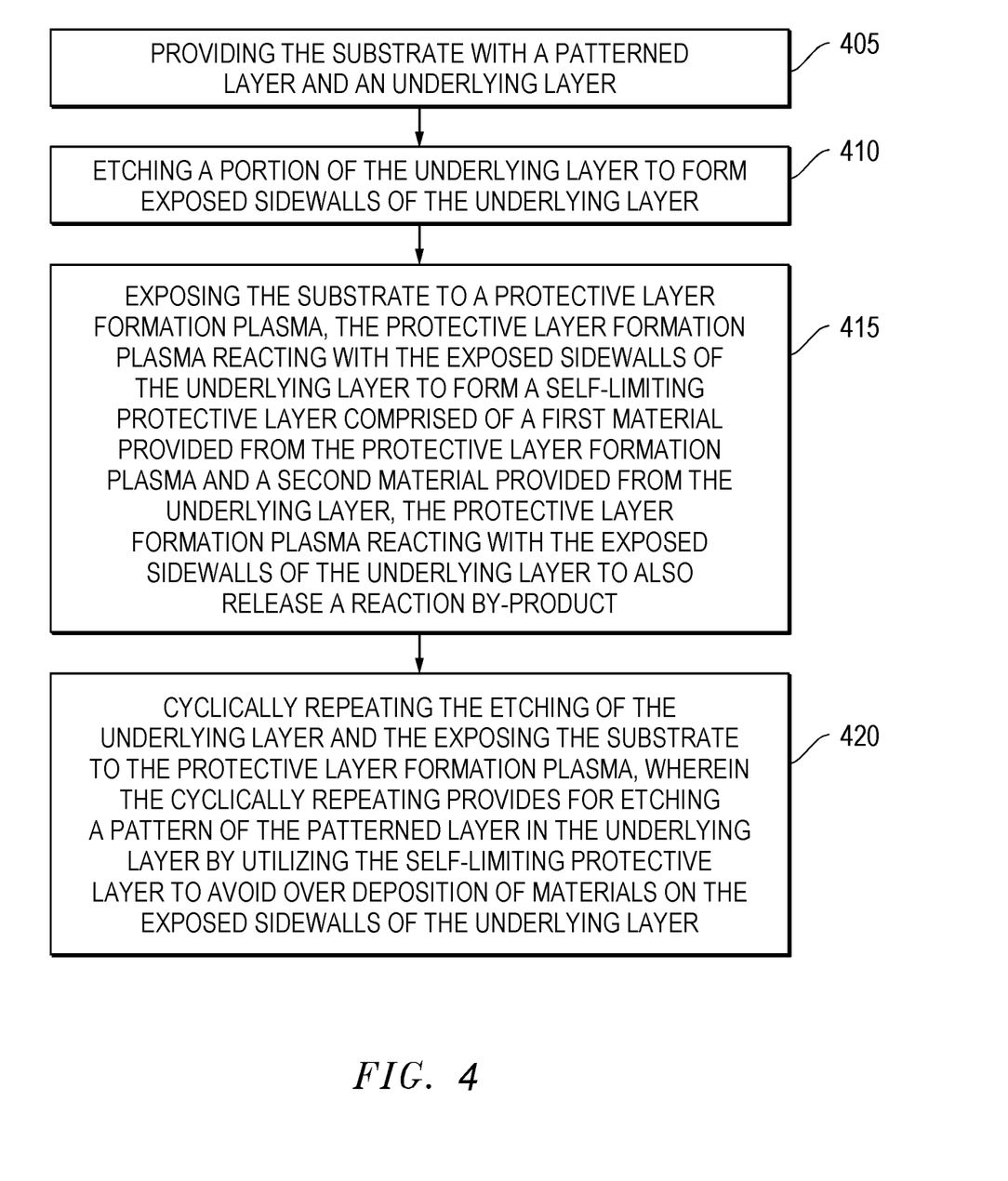
FIGS. 4 and 5 illustrate exemplary methods for utilizing the techniques described herein.
Figure 5:
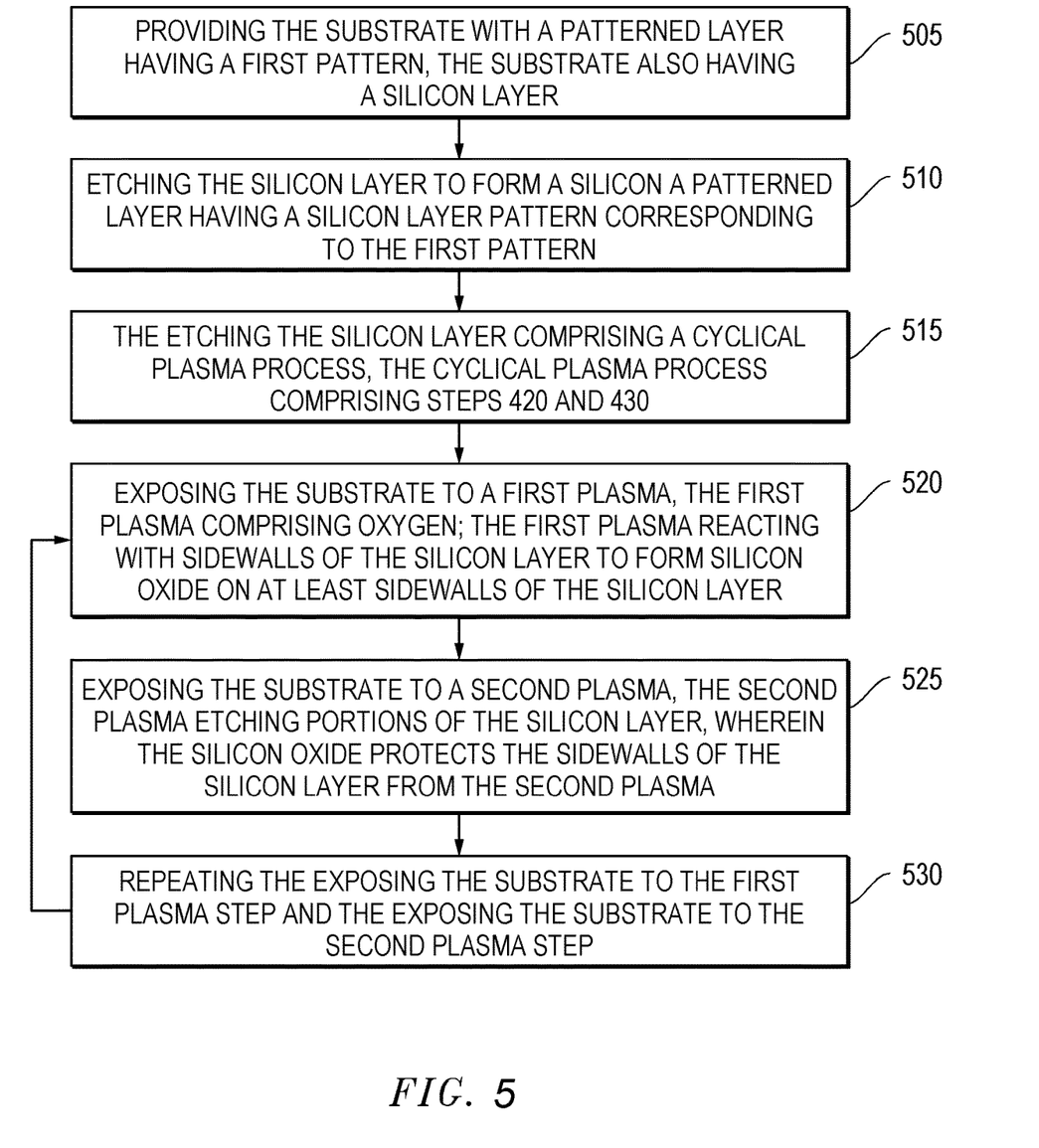

FIGS. 4-5 illustrate exemplary methods for use of the processing techniques described herein. It will be recognized that the embodiments of FIGS. 4-5 are merely exemplary and additional methods may utilize the techniques described herein. Further, additional processing steps may be added to the methods shown in the FIGS. 4-5 as the steps described are not intended to be exclusive. Moreover, the order of the steps is not limited to the order shown in the figures as different orders may occur and/or various steps may be performed in combination or at the same time.

FIG. 4 illustrates a method for etching a substrate. The method comprises step 405 of providing the substrate with a patterned layer and an underlying layer and step 410 of etching a portion of the underlying layer to form exposed sidewalls of the underlying layer. The method also includes step 415 of exposing the substrate to a protective layer formation plasma, the protective layer formation plasma reacting with the exposed sidewalls of the underlying layer to form a self-limiting protective layer comprised of a first material provided from the protective layer formation plasma and a second material provided from the underlying layer, the protective layer formation plasma reacting with the exposed sidewalls of the underlying layer to also release a reaction by-product. The method further comprising step 420 cyclically repeating the etching of the underlying layer and the exposing the substrate to the protective layer formation plasma, wherein the cyclically repeating provides for etching a pattern of the patterned layer in the underlying layer by utilizing the self-limiting protective layer to avoid over deposition of materials on the exposed sidewalls of the underlying layer.

FIG. 5 illustrates a method of etching a substrate. The method comprises step 505 of providing the substrate with a patterned layer having a first pattern, the substrate also having a silicon layer. The method further includes step 510 of etching the silicon layer to form a silicon patterned layer having a silicon layer pattern corresponding to the first pattern. As shown as step 515, the etching the silicon layer comprising a cyclical plasma process, the cyclical plasma process comprising step 520 of exposing the substrate to a first plasma, the first plasma comprising oxygen; the first plasma reacting with sidewalls of the silicon layer to form silicon oxide on at least sidewalls of the silicon layer, and step 525 of exposing the substrate to a second plasma, the second plasma etching portions of the silicon layer, wherein the silicon oxide protects the sidewalls of the silicon layer from the second plasma. The method further includes step 530 of repeating the exposing the substrate to the first plasma step and the exposing the substrate to the second plasma step.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and methods of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of etching a substrate, the method comprising:
   providing the substrate with a patterned layer and an underlying layer;
   etching a portion of the underlying layer to form exposed sidewalls of the underlying layer;
   exposing the substrate to a protective layer formation plasma, the protective layer formation plasma reacting with the exposed sidewalls of the underlying layer to form a self-limiting protective layer comprised of a first material provided from the protective layer formation plasma and a second material provided from the underlying layer, the protective layer formation plasma reacting with the exposed sidewalls of the underlying layer to also release a reaction by-product, the reaction by-product being a volatile gas based on a component of the protective layer formation plasma;
   cyclically repeating the etching of the underlying layer and the exposing the substrate to the protective layer formation plasma; and
   wherein the cyclically repeating provides for etching a pattern of the patterned layer in the underlying layer by utilizing the self-limiting protective layer to avoid over deposition of materials on the exposed sidewalls of the underlying layer.

2. The method of claim 1, wherein the underlying layer comprises silicon.

3. The method of claim 2, wherein the self-limiting protective layer comprises silicon oxide.

4. The method of claim 3, wherein the reaction by-product comprises oxygen.

5. The method of claim 1, wherein the self-limiting protective layer is 10 nm or less thick.

6. The method of claim 1, wherein the self-limiting protective layer is 2 nm or less thick.

7. The method of claim 1, wherein the pattern of the patterned layer is a via hole or contact hole.

8. The method of claim 7, the via hole or contact hole is a square or a rectangle.

9. The method of claim 8, wherein the cyclically repeating the etching and exposing is configured to optimize throughput and structure profile.

10. The method of claim 9, wherein the method is optimized by controlling oxidation time, oxygen pressure, and oxygen flowrate.

11. A method of etching a substrate, the method comprising:
    providing the substrate with a patterned layer having a first pattern, the substrate also having a silicon layer; and
    etching the silicon layer to form a silicon patterned layer having a silicon layer pattern corresponding to the first pattern;
    the etching the silicon layer comprising a cyclical plasma process, the cyclical plasma process comprising:
    exposing the substrate to a first plasma, the first plasma comprising oxygen, the first plasma reacting with at least some exposed surfaces of the silicon layer to form silicon oxide on the at least some exposed surfaces of the silicon layer and to release a reaction by-product, the reaction by-product being a volatile gas based on a composition of the first plasma, the at least some exposed surfaces comprising non-sidewall regions and sidewalls;
    exposing the substrate to a second plasma, the second plasma etching portions of the silicon layer and removing the silicon oxide formed on the non-sidewall regions of the silicon layer, the second plasma being formed using an etchant gas and argon gas, the argon gas assisting in directionally etching the silicon oxide formed on the non-sidewall regions of the silicon layer on which the silicon oxide was formed by providing a directional sputtering effect to remove the silicon oxide formed on the non-sidewall regions of the silicon layer on which the silicon oxide was formed;

wherein the silicon oxide protects the sidewalls of the silicon layer from the second plasma; and repeating the exposing the substrate to the first plasma and the exposing the substrate to the second plasma.

12. The method of claim 11, wherein the etchant gas comprises chlorine, hydrogen chloride, hydrogen bromide, or silicon fluorine.

13. The method of claim 11, wherein a formation rate of the silicon oxide in the first plasma decreases with respect to time of the exposing the substrate to a first plasma step.

14. The method of claim 13, wherein the silicon oxide on at least sidewalls of the silicon layer is 10 nm or less thick.

15. The method of claim 13, wherein the silicon oxide on at least sidewalls of the silicon layer is 2 nm or less thick.

16. The method of claim 11, wherein the silicon oxide on at least sidewalls of the silicon layer is 10 nm or less thick.

17. The method of claim 11, wherein the silicon oxide on at least sidewalls of the silicon layer is 2 nm or less thick.

18. The method of claim 11, wherein the first plasma is an oxygen plasma formed in a plasma chamber using an oxygen flow rate of about 500 standard cubic centimeters per minute, about 200 Watts power of 60 megahertz, and a pressure of about 50 mTorr.

19. The method of claim 3, wherein the protective layer formation plasma is an oxygen plasma formed in a plasma chamber using an oxygen flow rate of about 500 standard cubic centimeters per minute, about 200 Watts power of 60 megahertz, and a pressure of about 50 mTorr.

20. A method, comprising:
providing a substrate with a patterned layer and an underlying layer; and etching, according to the patterned layer, the underlying layer to form holes in the underlying layer;

wherein etching the underlying layer comprises a cyclical plasma process, the cyclical plasma process comprising:

in a first plasma step, forming a protective layer on at least some exposed surfaces of the underlying layer by exposing the substrate to a first plasma, the first plasma reacting with the at least some exposed surfaces of the underlying layer to form the protective layer and to release a reaction by-product, the reaction by-product being a volatile gas based on a composition of the first plasma, the at least some exposed surfaces comprising sidewall surfaces of the holes and top surfaces of the underlying layer at respective bottoms of the holes formed in the underlying layer;

in a second plasma step, removing the protective layer from the top surfaces of the underlying layer at the respective bottoms of the holes and etching portions of the underlying layer by exposing the substrate to a second plasma, the second plasma being formed using an etchant gas and an inert gas, the inert gas assisting in directionally etching the protective layer formed on the top surfaces of the underlying layer at the respective bottoms of the holes by providing a directional sputtering effect to remove the protective layer from the top surfaces of the underlying layer at the respective bottoms of the holes, the protective layer protecting the sidewalls of the holes from etching by the second plasma; and repeating the exposing the substrate to the first plasma and the exposing the substrate to the second plasma.

21. The method of claim 20, wherein:
the underlying layer comprises silicon;
the first plasma comprises oxygen; and
the protective layer comprises silicon oxide.

22. The method of claim 21, wherein:
the first plasma is generated from oxygen gas; and
the reaction by-product comprises oxygen atoms as radicals or oxygen gas.

* * * * *